(12) United States Patent
Saeki et al.

(10) Patent No.: US 10,014,863 B2
(45) Date of Patent: Jul. 3, 2018

(54) DEVICE AND METHOD FOR VOLTAGE BOOSTING AND DISPLAY PANEL DRIVER INCORPORATING THE SAME

(71) Applicant: Synaptics Japan GK, Tokyo (JP)

(72) Inventors: Yutaka Saeki, Tokyo (JP); Kenichi Kaneshige, Tokyo (JP)

(73) Assignee: Synaptics Japan GK, Nakano, Tokyo (JP)

( * ) Notice: Subject to any disclaimer, the term of this patent is extended or adjusted under 35 U.S.C. 154(b) by 112 days.

(21) Appl. No.: 14/849,704

(22) Filed: Sep. 10, 2015

(65) Prior Publication Data

US 2016/0079976 A1    Mar. 17, 2016

(30) Foreign Application Priority Data

Sep. 11, 2014   (JP) ................... 2014-185631

(51) Int. Cl.
  *G09G 5/00*      (2006.01)
  *H03K 19/003*    (2006.01)
(52) U.S. Cl.
  CPC ....... *H03K 19/00315* (2013.01); *G09G 5/006* (2013.01); *G09G 2310/0289* (2013.01); *G09G 2330/02* (2013.01)

(58) Field of Classification Search
  None
  See application file for complete search history.

(56) References Cited

U.S. PATENT DOCUMENTS

2006/0132417 A1*  6/2006  Shigenobu ........... G09G 3/3696
                                                     345/98
2008/0094386 A1*  4/2008  Park ..................... G09G 3/3696
                                                     345/212
2008/0272832 A1   11/2008 Kim et al.

FOREIGN PATENT DOCUMENTS

JP    2001210076 A    8/2001
JP    2002186247 A    6/2002

OTHER PUBLICATIONS

Chinese Office Action dated May 23, 2018, Application No. CN 2014-185631, with English Translation, consists of 6 pages.

* cited by examiner

*Primary Examiner* — Tony N Ngo
(74) *Attorney, Agent, or Firm* — Patterson + Sheridan, LLP

(57) ABSTRACT

An integrated circuit device boosts an output voltage which is to be boosted based on the reference power supply voltage, based on another power supply voltage before the reference power supply voltage is supplied.

19 Claims, 12 Drawing Sheets

DEVICE AND METHOD FOR VOLTAGE BOOSTING AND DISPLAY PANEL DRIVER INCORPORATING THE SAME

CROSS REFERENCE

This application is based on Japanese Patent Application No. JP 2014-185631 and claims the benefit of priority of it. The disclosure thereof is incorporated herein by reference.

TECHNICAL FIELD

The present invention is related to an integrated circuit device, a display panel driver, a display apparatus, and a voltage boosting method, and especially, to an integrated circuit device which has a charge pump circuit, a display panel driver, a display apparatus and a voltage boosting method.

BACKGROUND ART

A positive side gate power supply voltage VGH and a negative side gate power supply voltage VGL which are supplied to a driver IC (Integrated Circuit) for driving a display apparatus are generated by a voltage boosting circuit based on a reference power supply voltage VCI. FIG. 1 is a block diagram showing a part of the configuration of a conventional driver IC. The driver IC shown in FIG. 1 contains a voltage boosting circuit 101 which generates the positive side gate power supply voltage VGH based on the reference power supply voltage VCI1, and a VCI power supply 102 which generates a positive side reference power supply voltage VCI1. The voltage boosting circuit 101 and the VCI power supply 102 are both started up in response to a control signal SEQ_ON. Specifically, as shown in FIG. 2, the generation (voltage boosting) of the reference power supply voltage VCI1 and the voltage boosting of the positive side gate power supply voltage VGH are started in synchronization with an active edge of a control signal SEQ_ON.

For example, as shown in FIG. 3, the voltage boosting circuit 101 is provided with a charge pump circuit which has voltage boosting switches SW11 to SW14 and capacitances C1 and C2. Each of the voltage boosting switches SW11 to SW14 is exemplified by a transfer gate as shown in FIG. 4. In detail, each of the voltage boosting switches SW11 to SW14 is provided with a P-channel transistor MP1 having a source connected with a node N1 and an N-channel transistor MN1 having a drain connected with a node N2. The transfer gate controls an electric connection between the node N1 and the node N2 according to a clock signal CLK supplied to the gate of the P-channel transistor MP1 and a clock signal CLKB supplied to the gate of the N-channel transistor MN1.

The charge pump circuit shown in FIG. 3 outputs a voltage of twice of the reference power supply voltage VCI1, which is supplied to a node N11, as the positive side gate power supply voltage VGH by the charging and discharging the capacitances C1 and C2 through a switching operation by the voltage boosting switches SW11 to SW14.

The positive side gate power supply voltage VGH is supplied to a gate driving circuit (not shown) and is used as the positive side power supply voltage to drive gate lines of the display panel.

CITATION LIST

Patent Literature 1 JP 2008-277832A

SUMMARY

An integrated circuit device, a display panel driver, a display apparatus, and a voltage boosting method are described herein. In one embodiment, an integrated circuit device is provided that includes a voltage boosting circuit and a precharging circuit. The voltage boosting circuit is configured to boost an output voltage based on a reference power supply voltage. The precharging circuit is configured to boost the output voltage based on another power supply voltage before the reference power supply voltage is supplied to the voltage boosting circuit. The voltage boosting circuit is operational to boost the output voltage, by a switching operation of transistors, to back gates of which the output voltage is supplied.

In another embodiment, a display panel driver is provided that includes an integrated circuit device and a gate driving circuit. The gate driving circuit is configured to generate a gate line drive signal based on an output voltage to drive gate lines of a display panel. The integrated circuit device includes a voltage boosting circuit and a precharging circuit. The voltage boosting circuit is configured to boost the output voltage based on a reference power supply voltage. The precharging circuit is configured to boost the output voltage based on another power supply voltage before the reference power supply voltage is supplied to the voltage boosting circuit. The voltage boosting circuit is operational to boost the output voltage, by a switching operation of transistors to back gates of which the output voltage is supplied.

In another embodiment, a display apparatus is provided that includes a display panel driver and a display panel having gate lines driven by a gate line drive signal. The display panel driver includes an integrated circuit device and a gate driving circuit. The gate driving circuit is configured to generate the gate line drive signal based on an output voltage to drive the gate lines of the display panel. The integrated circuit device includes a voltage boosting circuit and a precharging circuit. The voltage boosting circuit configured to boost the output voltage based on a reference power supply voltage. The precharging circuit is configured to boost the output voltage based on another power supply voltage before the reference power supply voltage is supplied to the voltage boosting circuit. The voltage boosting circuit is operational to boost the output voltage, by a switching operation of transistors to back gates of which the output voltage is supplied.

In yet another embodiment, a voltage boosting method is provided that includes boosting an output voltage based on another power supply voltage supplied before a reference power supply voltage is supplied to a voltage boosting circuit, and boosting the output voltage based on the reference power supply voltage by the voltage boosting circuit, wherein the voltage boosting circuit is operational to boost the output voltage, by a switching operation of transistors, to back gates of which the output voltage is supplied.

DETAILED DESCRIPTION

Figure 3:
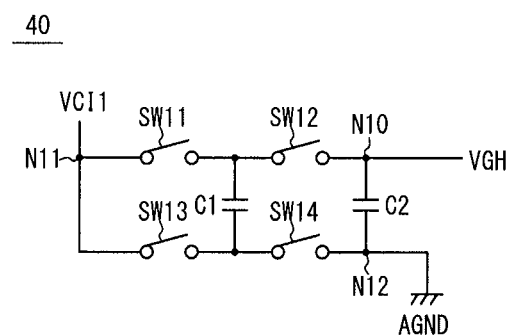
FIG. 3 is a diagram showing an example of the configuration of a charge pump circuit.

It is desirable that the P-channel transistor MP1 and the N-channel transistor MN1 which configure each of the voltage boosting switches SW11 to SW14 shown in FIG. 3 are MOS transistors integrated on an identical substrate. In this case, the back gate of the P-channel transistor MP1 is connected with the node N10 to which the positive side gate power supply voltage VGH is supplied through an N well formed on a P-type substrate.

Figure 1:
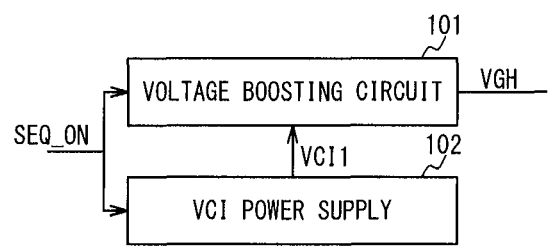
FIG. 1 is a block diagram showing a part of the configuration of a conventional driver IC.
Figure 2:
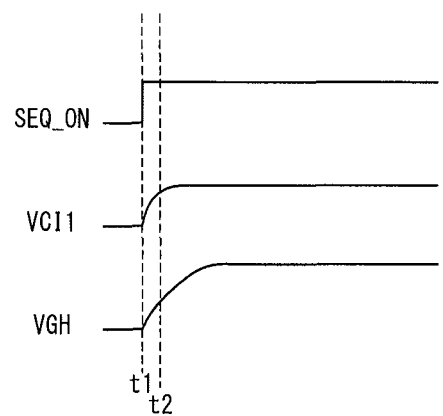
FIG. 2 is a timing chart showing an example of a start-up operation by the conventional driver IC.

Generally, the VCI power supply 102 generates the reference power supply voltage VCI1 by a regulator. Therefore, the reference power supply voltage VCI1 is boosted faster to a predetermined voltage than the positive side gate power supply voltage VGH by the charge pump circuit 40. In this case, as shown in FIG. 2, when the voltage boosting circuit 101 and the VCI power supply 102 are started up at the same time, there is a case that the reference power supply voltage VCI1 exceeds the positive side gate power supply voltage VGH for a period from a start-up time t1 to a time t2. At this time, in the P-channel transistor MP1, because the back gate becomes lower in voltage than a P-type diffusion layer connected with a node N11 to which the reference power supply voltage VCI1 is supplied, a parasitic PNP bipolar transistor turns on to cause a latch-up. When the latch up occurs, a desired positive side gate power supply voltage VGH cannot be outputted so that it is not possible to normally drive the display apparatus.

In order to prevent the latch-up which occurs at the time of the start-up, a schottky barrier diode is provided between the node N11 and a node N10. A bias is given between the node N11 and the node N10 by a schottky barrier diode, to minimize the voltage difference between the node N11 and the node N10 so that the turn-on of the parasitic transistor is prevented. However, when the schottky barrier diode is utilized, the number of external parts increases so that a mount area increases.

A technique of preventing the latch-up at the time of the start-up of the driver IC without using the schottky barrier diode is disclosed in JP 2008-277832A (Patent Literature 1). A charge pump circuit disclosed in Patent Literature 1 has a latch-up prevention section (N-channel transistor) which prevents the latch-up by raising a substrate voltage of the voltage boosting switches to the ground voltage until the positive side gate power supply voltage VGH shows a predetermined value. In this case, until the positive side gate power supply voltage VGH raises to the predetermined value, the negative side gate power supply voltage VGL is raised to the ground voltage by the latch-up prevention section.

An advantage of the present technology is to provide an integrated circuit device, a display panel driver, a display apparatus and an operating method of the integrated circuit device, in which the latch-up can be prevented at the time of start of a voltage boosting operation.

The integrated circuit device of the present technology boosts an output voltage to be boosted based on a reference power supply voltage, by using another power supply voltage before the reference power supply voltage is supplied.

The integrated circuit device of the present technology can be desirably used as the driver IC which drives a display panel.

Accordingly, the latch-up can be prevented at the time of start of the voltage boosting operation.

Hereinafter, embodiments of the present technology will be described with reference to the attached drawings. In the drawing, an identical or similar reference numeral shows an identical or similarity component. Below, the details of an integrated circuit device according to the present technology will be described, using the integrated circuit device loaded on a driver IC for driving a display panel as an example.
(Overview)

An integrated circuit device according to the present technology has a voltage boosting circuit which generates a gate power supply voltage as an output voltage and a precharging circuit. The voltage boosting circuit boosts a gate power supply voltage to a predetermined voltage by a voltage boosting operation using voltage boosting switches in which the gate power supply voltage is supplied to a back gate. The precharging circuit precharges a node to which the gate power supply voltage is planned to be supplied, by use of another power supply voltage which is different from a reference power supply voltage, before the reference power supply voltage is supplied to the voltage boosting circuit. Thus, in the voltage boosting switches which carry out the voltage boosting operation, a voltage difference between the back gate and a diffusion layer to which the reference power supply voltage is supplied, does not exceed the operation voltage of a parasitic transistor, so that the occurrence of latch-up can be prevented.

First Embodiment

In the first embodiment, the supply of a reference power supply voltage VCI1 to a voltage boosting circuit and a precharging operation to a node to which a positive side gate power supply voltage VGH (to be referred to as an output voltage) is supplied, are controlled according to a control signal from a logic circuit (a control signal generating circuit). Hereinafter, referring to FIG. 5 to FIG. 9, a display apparatus according to the first embodiment of the present disclosure will be described.

(Configuration of Display Apparatus)

Figure 5:
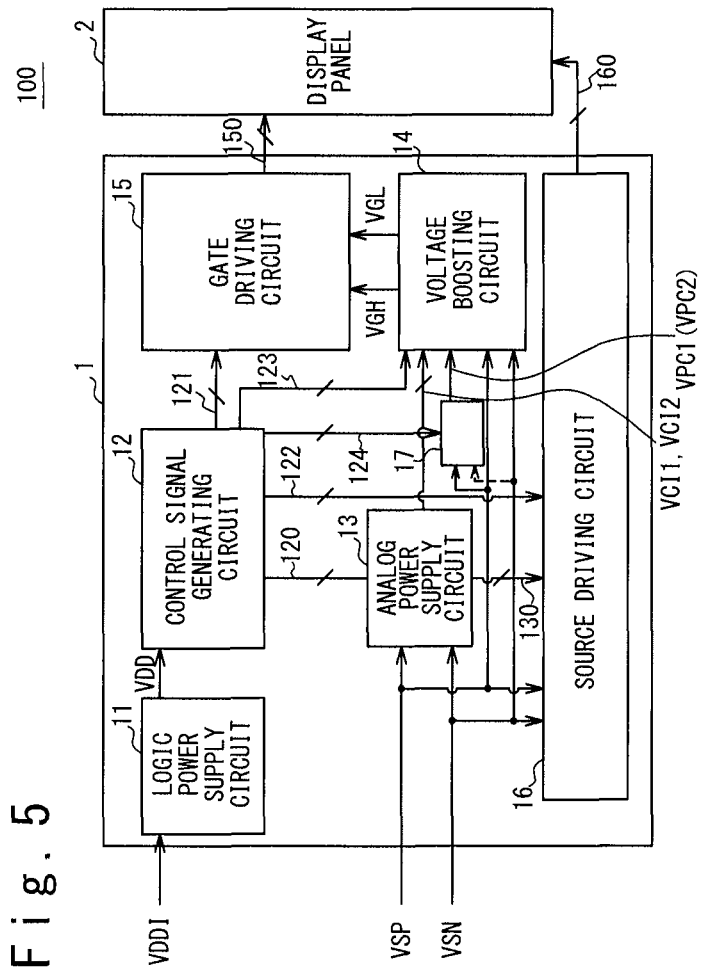
FIG. 5 is a diagram showing an example of the configuration of a display apparatus in first and third embodiments.

FIG. 5 is a diagram showing an example of the configuration of the display apparatus 100 in the first embodiment. Referring to FIG. 5, the display apparatus 100 has a driver IC 1 and a display panel 2. The driver IC 1 has a gate driving circuit 15 which drives gate lines (not shown) of the display panel 2, and a source driving circuit 16 which drives the source lines (not shown). In detail, the driver IC 1 has a logic power supply circuit 11, a control signal generating circuit 12, an analog power supply circuit 13, a voltage boosting circuit 14, the gate driving circuit 15, the source driving circuit 16, and a precharging circuit 17. It is desirable that the logic power supply circuit 11, the control signal generating circuit 12, the analog power supply circuit 13, the voltage boosting circuit 14, the gate driving circuit 15, the source driving circuit 16 and the precharging circuit 17 are integrated on one chip.

The logic power supply circuit 11 generates a logic power supply voltage VDD according to a logic power supply voltage VDDI which is supplied from an external power supply (not shown). The control signal generating circuit 12 is a logic circuit which operates according to the logic power supply voltage VDD. The control signal generating circuit 12 generates control signals 120 to 124, each of which prescribes the operation timing of a component in the driver IC 1. For example, the control signal generating circuit 12 outputs the control signal 120 to the analog power supply circuit 13, to control a start-up timing of the analog power supply circuit 13. The control signal generating circuit 12 outputs the control signal 121 to the gate driving circuit 15 to control a timing of a gate driving operation of the gate driving circuit 15. The control signal generating circuit 12 outputs the control signal 122 to the source driving circuit 16 to control a timing of a source driving operation of the source driving circuit 16. The control signal generating circuit 12 outputs the control signal 123 to the voltage boosting circuit 14 to control a start-up of the voltage boosting circuit 14 and an voltage boosting operation. The control signal generating circuit 12 outputs the control signal 124 to the precharging circuit 17 to control a start-up of the precharging circuit 17 and a precharging operation.

Figure 6:
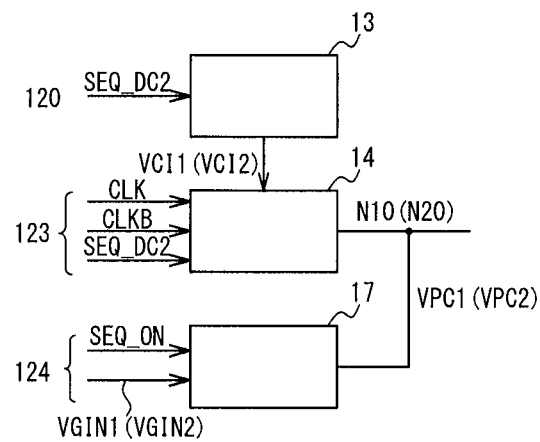
FIG. 6 is a diagram showing an example of the configuration of a voltage boosting circuit and a precharging circuit, which are provided in an integrated circuit device in the first and third embodiments.

The analog power supply circuit 13 generates reference power supply voltages VCI1 and VCI2 based on analog power supply voltages VSP and VSN supplied from the external power supply. Referring to FIG. 6, the analog power supply circuit 13 generates the reference power supply voltages VCI1 and VCI2 according to the control signal 120 which contains the control signal SEQ_DC2. In detail, the analog power supply circuit 13 has a regulator (not shown) which starts to generate the reference power supply voltages VCI1 and VCI2 at timings according to the control signal SEQ_DC2. For example, the analog power supply circuit 13 includes a positive side voltage regulator (not shown) which generates a positive reference power supply voltage VCI1 (e.g. 6 V) from a positive side analog power supply voltage VSP, and a negative side voltage regulator (not shown) which generates a negative side reference power supply voltage VCI2 (e.g. −6 V) from a negative side analog power supply voltage VSN. The analog power supply circuit 13 may be provided outside the driver IC 1. In this case, it is desirable that the reference power supply voltages VCI1 and VCI2 are supplied to the voltage boosting circuit 14 at predetermined timings to be described later.

The voltage boosting circuit 14 outputs a positive side gate power supply voltage VGH generated by boosting the reference power supply voltage VCI1 and outputs a negative side gate power supply voltage VGL generated by negatively boosting the reference power supply voltage VCI2. In detail, referring to FIG. 6, the voltage boosting operation of the voltage boosting circuit 14 in the first embodiment is controlled according to clock signals CLK and CLKB and the control signal 123 which contains the control signal SEQ_DC2.

Figure 4:
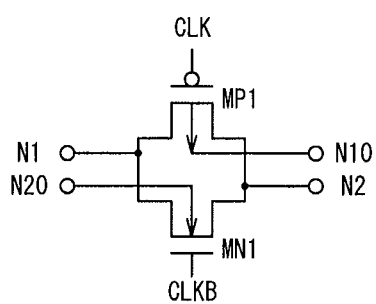
FIG. 4 is a diagram showing an example of the configuration of a voltage boosting switch provided in the charge pump circuit.

In more detail, the voltage boosting circuit 14 has the charge pump circuit 40 which generates the positive side gate power supply voltage VGH by boosting the reference power supply voltage VCI1 (reference FIG. 3 and FIG. 4). Referring to FIG. 3, the charge pump circuit 40 has voltage boosting switches SW11 to SW14 and capacitances C1 and C2. In detail, the voltage boosting switch SW11 and the voltage boosting switch SW12 are connected in series between a node N11 to which the reference power supply voltage VCI1 is supplied, and a node N10. The voltage boosting switch SW13 and the voltage boosting switch SW14 are connected in series between the node N11 and a ground node N12. The capacitance C1 is connected between a node between the voltage boosting switch SW11 and the voltage boosting switch SW12 and a node between the voltage boosting switch SW13 and the voltage boosting switch SW14. Also, the capacitance C2 is connected between the node N10 and the ground node N12. The voltage boosting switches SW11 to SW14 are exemplified by transfer gates shown in FIG. 4, and the switching operation is controlled based on the clock signals CLK and CLKB which are supplied from the control signal generating circuit 12. Here, the clock signal CLKB (CLK) having a logical value opposite to that of the clock signal CLK (CLKB) which is supplied to P-channel transistors MP1 (N-channel transistors) of the voltage boosting switches SW11 and SW14, is supplied to the P-channel transistors MP1 (N-channel transistors) of the voltage boosting switches SW12 and SW13. Also, the operation start and operation end of the charge pump circuit 40 are controlled based on the control signal SEQ_DC2 from the control signal generating circuit 12. For example, when the control signal SEQ_DC2 is in a low level, the charge pump circuit 40 does not operate and when it is in a high level, the charge pump circuit 40 carries out the voltage boosting operation.

The charge pump circuit 40 outputs a voltage of twice of the reference power supply voltage VCI1 supplied to the node N11, to the node N10 as the positive side gate power supply voltage VGH, by charging and discharging the capacitances C1 and C2 through the switching operation of the voltage boosting switches SW11 to SW14. Note that in FIG. 3, the charge pump circuit 40 which boosts the voltage to twice, has been described as an example, but a multiple of the voltage boosting can be optionally changed by changing the number of connections of the voltage boosting switches and the capacitances.

Although omitting the description of a detail configuration, the voltage boosting circuit 14 has a general charge pump circuit which generates a negative side gate power supply voltage VGL by carrying out a voltage dropping operation (a negatively boosting operation) to the reference power supply voltage VCI2. For example, the charge pump circuit which generates the negative side gate power supply voltage VGL has a configuration similar to the charge pump circuit 50 shown in FIG. 13. However, although not shown in FIG. 13, the negative side analog power supply voltage VSN is supplied to a node N20 through a diode connected in a forward direction. Note that in FIG. 13, the charge pump circuit 50 which negatively boosts the voltage to twice is exemplified, but it is possible to optionally change the number of the connections between the voltage boosting switches and the capacitances.

The gate driving circuit 15 generates a gate line driving signal 150 for driving gate lines (not shown) of the display panel 2 based on the positive side gate power supply voltage VGH and the negative side gate power supply voltage VGL. At this time, the selection of the gate line to be driven, a driving timing and so on are controlled based on the control signal 121.

The source driving circuit 16 generates a source line driving signal 160 for driving source lines (not shown) of the display panel 2 based on the analog power supply voltages VSP and VSN. At this time, the selection of the source line to be driven, the drive timing and so on are controlled based on the control signal 122.

The specific configurations and operations of the gate driving circuit 15 and the source driving circuit 16 are same as those of general gate driving circuit and source driving circuit.

The precharging circuit 17 in the first embodiment boosts the positive side gate power supply voltage VGH based on a precharge voltage VPC1 determined according to the positive side analog power supply voltage VSP, before the reference power supply voltage VCI1 is supplied to the voltage boosting circuit 14.

Referring to FIG. 6, in the first embodiment, a supplying operation of the precharge voltage VPC1 to the node N10 (positive side gate power supply voltage VGH) is controlled according to the control signal 124 which contains a control signal SEQ_ON and a control signal VGIN1.

Figure 7:
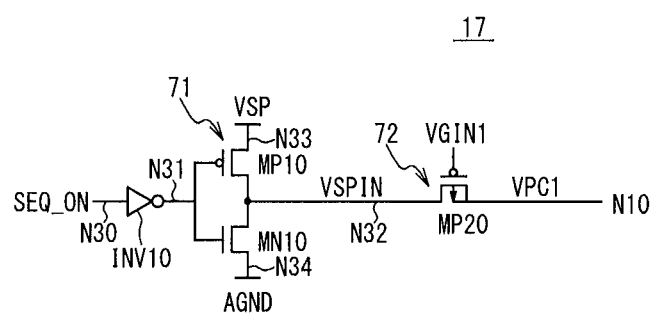
FIG. 7 is a diagram showing an example of the configuration of the precharging circuit in the first embodiment.

FIG. 7 is a diagram showing an example of the configuration of the precharging circuit 17 of the first embodiment. Referring to FIG. 7, the precharging circuit 17 of the first embodiment has an inverter INV10, a CMOS circuit 71 and a precharge control switch 72. The inverter INV10 is connected between a node N30 to which the control signal SEQ_ON is supplied, and a node N31 as an input of the CMOS circuit 71. The P-channel transistor MP20 which is exemplified by the P-channel MOS transistor, is suitable as the precharge control switch 72 of the present embodiment. The P-channel transistor MP20 is connected between a node N32 as the output of the CMOS circuit 71 and the node N10 to which the positive side gate power supply voltage VGH is supplied. The control signal VGIN1 is supplied to the gate of the P-channel transistor MP20. The CMOS circuit 71 includes a P-channel transistor MP10 having a source connected with a node N33 to which the positive side analog power supply voltage VSP is supplied, and a N-channel transistor MN10 having a source connected with a node N34 of the ground voltage. The gate of the P-channel transistor MP10 and the gate of the N-channel transistor MN10 are connected with the node N31 in common and the drains thereof are connected with the node N32 in common.

The CMOS circuit 71 supplies the analog power supply voltage VSP to the node N32 when the logical level of the control signal SEQ_ON transits to the high level. Thus, the voltage VSPIN of the node N32 rises to the analog power supply voltage VSP. For the above operation period, the P-channel transistor MP20 is turned on in response to the supply of the control signal VGIN1 in the low level, so that the voltage VSPIN of the node N32 is supplied to the node N10 as the precharge voltage VPC1. Thus, the voltage of the node N10 (the positive side gate power supply voltage VGH) rises to the analog power supply voltage VSP. That is, the precharging circuit 17 supplies the precharge voltage VPC1 to the node N10 while the control signal SEQ_ON is in the high level and the control signal VGIN1 is in the low level, so that the positive side gate power supply voltage VGH is boosted (precharged).

The precharge period to the node N10 (positive side gate power supply voltage VGH) is controlled based on the control signal VGIN1. In detail, when the control signal VGIN1 transits to the high level, the P-channel transistor MP20 is turned off, to block off the supply of the precharge voltage VPC1 to the node N10.

In this way, the precharging circuit 17 can boost the voltage of the node N10 (positive side gate power supply voltage VGH) (or precharges the node 10) to a predetermined voltage (e.g. analog power supply voltage VSP) for a period determined based on the control signal SEQ_ON and the control signal VGIN1. Note that the precharge period in the present embodiment is set by the control signal generating circuit 12.

In the above-mentioned configuration, by controlling supply timings of the power supply voltages from an external power supply (not shown) and the control signals 120, 123, and 124 appropriately, it can prevent the reference power supply voltage VCI1 from exceeding the positive side gate power supply voltage VGH at the time of the start-up of the driver IC 1. Hereinafter, the control of the supply timings of the power supply voltages and the voltage boosting operation of the positive side gate power supply voltage VGH at the timing of the start-up of the driver IC 1 will be described in detail.

(Supply Timings of Power Supply Voltages and Boosting Operation of Positive Side Gate Power Supply Voltage VGH)

Figure 8:
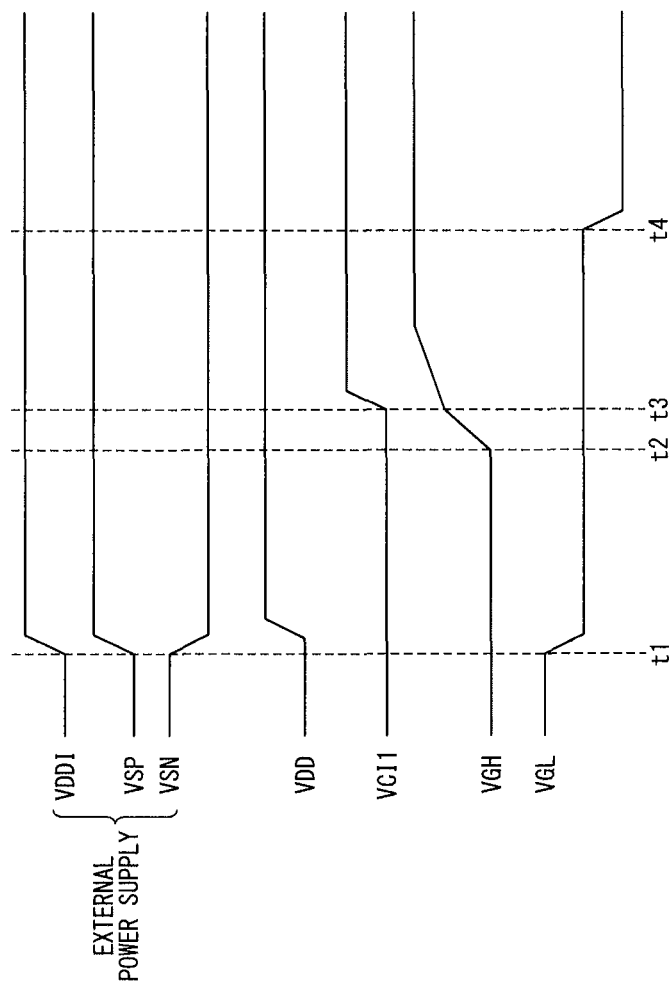
FIG. 8 is a timing chart showing an example of the supply timing of power supply voltages in the first and second embodiments.
Figure 9:
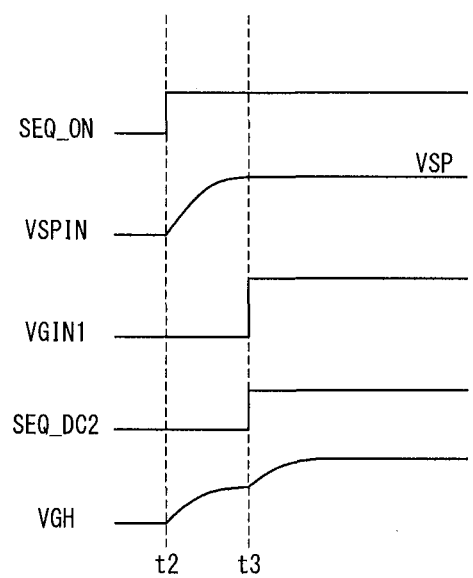
FIG. 9 is a timing chart showing an example of a start-up operation of the driver IC in the first and second embodiments.

FIG. 8 is a timing chart showing an example of the supply timings of the power supply voltages in the first embodiment. Also, FIG. 9 is a timing chart showing an example of the start-up operation of the driver IC in the first embodiment.

Referring to FIG. 8, the logic power supply voltage VDDI, the analog power supply voltages VSP and VSN are supplied from the external power supply (not shown) at time t1. In this case, the negative side gate power supply voltage VGL drops down according to the dropping down of the negative side analog power supply voltage VSN. Although omitting the detail description in this case, the negative side charge pump circuit in the first embodiment has a configuration similar to the charge pump circuit 50 shown in FIG. 13, and the negative side analog power supply voltage VSN is supplied to the node N20 through a diode (not shown). Therefore, at the time t1, the negative side gate power supply voltage VGL drops down. Also, with supply of the logic power supply voltage VDDI, the logic power supply voltage VDD results in a desired voltage and the control signal generating circuit 12 starts the operation.

The positive side gate power supply voltage VGH is precharged at time t2 after the logic power supply voltage VDD and the analog power supply voltages VSP and VSN reach the desired voltages and then an enough time passed away. Referring to FIG. 9, the control signal SEQ_ON transits to the high level at the time t2 and the voltage VSPIN at the output node (node N32) of the CMOS circuit 71 rises based on the positive side analog power supply voltage VSP. At this time, because the control signal VGIN1 is fixed to the low level, the voltage at a positive side output node (node N10) of the voltage boosting circuit 14 (positive side gate power supply voltage VGH) is boosted based on the precharge voltage VPC1 according to the voltage VSPIN. Also, at the time t2, because the logical level of the control signal SEQ_DC2 is fixed to the low level, the reference power supply voltage VCI1 is not supplied to the voltage boosting circuit 14 and the voltage boosting circuit 14 does not carry out the voltage boosting operation, as shown in FIG. 8.

Next, at time t3 at which the positive side gate power supply voltage VGH is raised up to a voltage substantially identical to the analog power supply voltage VSP, the control signal SEQ_DC2 transits to the high level. Thus, the reference power supply voltage VCI1 starts to be supplied to the voltage boosting circuit 14 and the voltage boosting circuit 14 starts the voltage boosting operation. On the other hand, at almost the same time as or after the transition of the control signal SEQ_DC2 to the high level, the control signal VGIN1 transits to the high level. Thus, the precharge control switch 72 (P-channel transistor MP20) is turned off and the voltage boosting operation (the precharging operation) of the positive side gate power supply voltage VGH by the precharging circuit 17 ends.

Since the time t3, by the voltage boosting operation by the voltage boosting circuit 14, the positive side gate power supply voltage VGH is boosted to a predetermined voltage (e.g. 15 V). Also, referring to FIG. 8, at time t4 when the positive side gate power supply voltage VGH becomes stable at the predetermined voltage, like a usual voltage boosting circuit, the negative side gate power supply voltage VGL is negatively boosted to a predetermined voltage (e.g. −15 V).

In the present embodiment, the supply of the reference power supply voltage VCI1 is not carried out for a period of the time t2 to the time t3, but the positive side gate power supply voltage VGH is boosted to the predetermined voltage (in this case, the positive side analog power supply voltage VSP (for example, 6 V)). Therefore, even if the reference power supply voltage VCI1 with a short rising time starts to be supplied at the time t3, the reference power supply voltage VCI1 never exceeds the positive side gate power supply voltage VGH. As a result, the parasitic transistor is never turned on in the switches SW11 to SW14 in the voltage boosting circuit 14 so that the occurrence of the latch up can be restrained.

Second Embodiment

In a second embodiment, the supply of the reference power supply voltage VCI1 to the voltage boosting circuit 14 and the precharging operation to the node N10 to which the positive side gate power supply voltage VGH (to be also referred to as an output voltage) is supplied, are controlled according to the control signal generated by the precharging circuit 17. Hereinafter, referring to FIG. 8 and FIG. 9 to FIG. 12, the display apparatus 100 according to the second embodiment of the present disclosure will be described.
(Configuration of Display Apparatus)

Figure 10:
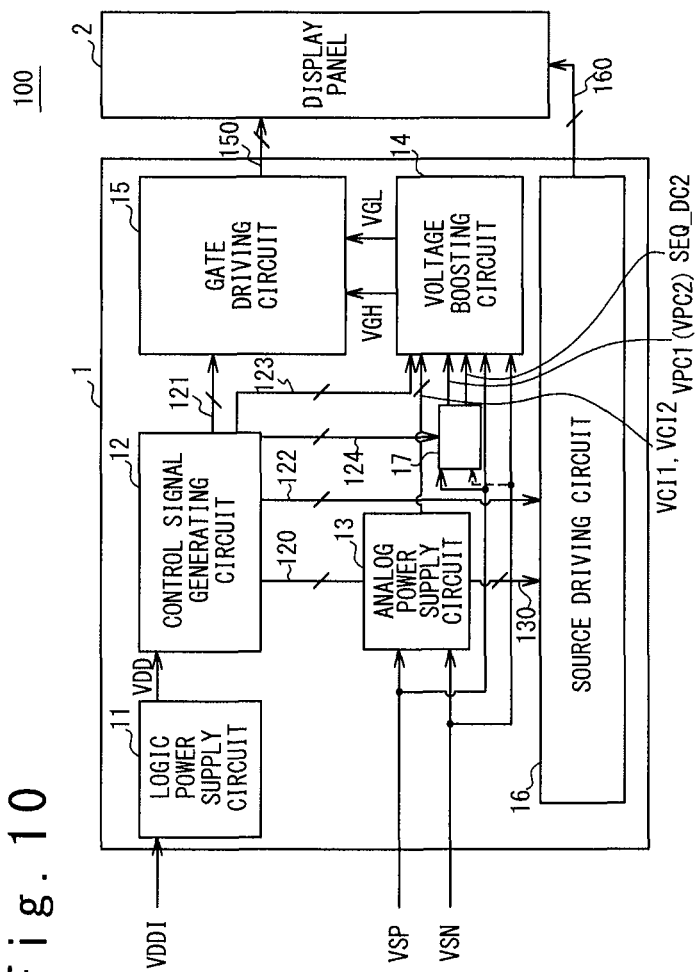
FIG. 10 is a diagram showing an example of the configuration of the display apparatus according to second and fourth embodiments of the present invention.

FIG. 10 is a diagram showing an example of the configuration of the display apparatus 100 in the second embodiment. Referring to FIG. 10, the display apparatus 100 has the driver IC 1 and the display panel 2. The second embodiment differs from the first embodiment in the point that the generation of the reference power supply voltage VCI1 and the voltage boosting operation of the voltage boosting circuit 14 are controlled by the precharging circuit 17. The configuration except for this different point is the same as the configuration in the first embodiment. Below, the difference from the first embodiment will be described.

Figure 11:
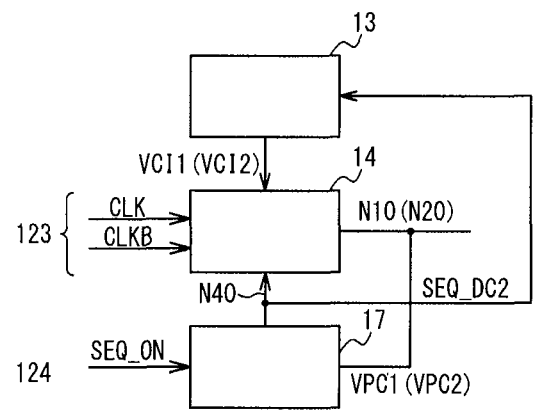
FIG. 11 is a diagram showing an example of the configuration of the voltage boosting circuit and the precharging circuit, which are provided in the integrated circuit device in the second and fourth embodiments.

Referring to FIG. 11, the voltage boosting operation of the voltage boosting circuit 14 in the second embodiment is controlled according to the control signal 123 which contains the clock signals CLK and CLKB, and the control signal SEQ_DC2 which is outputted from the precharging circuit 17.

The precharging circuit 17 in the second embodiment boosts the voltage of the node N10 to which the positive side gate power supply voltage VGH is planned to be supplied, based on the precharge voltage VPC1, before the reference power supply voltage VCI1 is supplied to the voltage boosting circuit 14. In detail, referring to FIG. 11, the supplying operation of the precharge voltage VPC1 to the node N10 is controlled according to the control signal 124 which contains the control signal SEQ_ON in the second embodiment.

Figure 12:
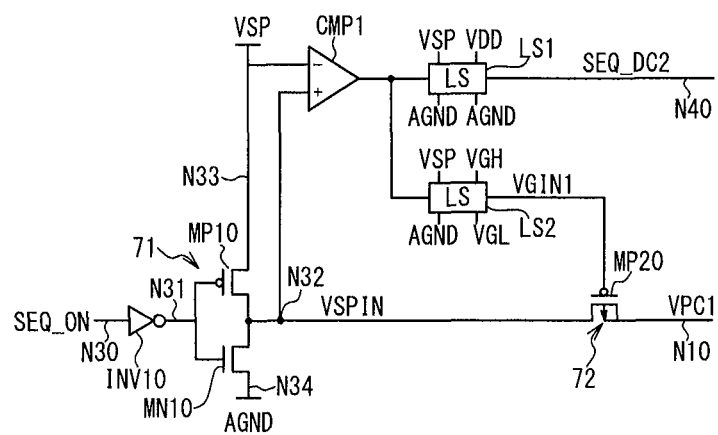
FIG. 12 is a diagram showing an example of the configuration of the precharging circuit in the second embodiment.

FIG. 12 is a diagram showing an example of the configuration of the precharging circuit 17 in the second embodiment. Referring to FIG. 12, the precharging circuit 17 in the second embodiment has the inverter INV10, the CMOS circuit 71, the precharge control switch 72, a comparator CMP1 and level shifters LS1 and LS2. The inverter INV10 is connected between the node N30 to which the control signal SEQ_ON is supplied and the node N31 as an input of the CMOS circuit 71. As the precharge control switch 72 in the present embodiment, the P-channel transistor MP20 which is exemplified as the P-channel MOS transistor is suitable, and is connected between the node N32 as an output of the CMOS circuit 71 and the node N10 to which the positive side gate power supply voltage VGH is supplied. A control signal VGIN1 is supplied to the gate of the P-channel transistor MP20. The CMOS circuit 71 includes the P-channel transistor MP10 having the source connected with the node N33 to which the positive side analog power supply voltage VSP is supplied, and the N-channel transistor MN10 having the source connected with the node N34 of the ground voltage. The gate of the P-channel transistor MP10 and the gate of the N-channel transistor MN10 are connected with the node N31 in common and each drain is connected with the node N32 in common.

The node N32 (the output of the CMOS circuit 71) is connected with a non-inversion input terminal of the comparator CMP1 and is connected with the node N10 through the precharge control switch 72 (P-channel transistor MP20). The node N33 is connected with an inversion input terminal of the comparator CMP1. The output terminal of the comparator CMP1 is connected with the input terminals of the level shifters LS1 and LS2. The output terminal of the level shifter LS1 is connected with the analog power supply circuit 13 and the voltage boosting circuit 14 through a node N40 (reference to FIG. 11 and FIG. 12). The output terminal of the level shifter LS2 is connected with a control node of the precharge control switch 72 (in this case, the gate of the P-channel transistor MP20).

The comparator CMP1 outputs a signal of a logical level determined according to the comparison result between the analog power supply voltage VSP which is supplied to the node N33 and the voltage VSPIN supplied to the node N32, to the level shifters LS1 and LS2. The level shifter LS1 shifts the output signal level of the comparator CMP1 from the analog power supply voltage level (VSP) to the logic power supply voltage level (VDD) and outputs it as the control signal SEQ_DC2. The level shifter LS2 shifts the output signal level of the comparator CMP1 from the analog voltage power level (VSP) to the gate power supply voltage level (VGH-VGL) and outputs it as the control signal VGIN1.

The CMOS circuit 71 supplies the analog power supply voltage VSP to the node N32 when the logical level of the control signal SEQ_ON transits to the high level. Thus, the voltage VSPIN at the node N32 rises to the analog power supply voltage VSP. When the voltage VSPIN is smaller than the positive side analog power supply voltage VSP, the comparator CMP1 outputs the signal in the low level. Specifically, when voltage VSPIN is smaller than a voltage obtained by subtracting an offset voltage from the positive side analog power supply voltage VSP (e.g. VSP—100 mV), the comparator CMP1 outputs the signal in the low level. At this time, the control signal VGIN1 outputted from the level shifter LS2 is in the low level so that the P-channel transistor MP20 is turned on. As a result, the voltage VSPIN at the node N32 is supplied to the node N10 as the precharge voltage VPC1, and the voltage at the node N10 (the positive side gate power supply voltage VGH) rises to the analog power supply voltage VSP. On the other hand, the control signal SEQ_DC2 outputted from the level shifter LS1 is set to the low level to stop the generating operation of the reference power supply voltage VCI1 by the analog power supply circuit 13 and the voltage boosting operation of the voltage boosting circuit 14 (or, to prevent the operations from starting).

When the voltage VSPIN becomes greater than the positive side analog power supply voltage VSP, the comparator CMP1 outputs the signal in the high level. Specifically, when the voltage VSPIN is greater than the voltage obtained by subtracting the offset voltage from the positive side analog power supply voltage VSP (e.g. VSP—100 mV), the comparator CMP1 outputs the signal in the high level. At this time, the control signal VGIN1 outputted from the level shifter LS2 is set to the high level, so that the P-channel transistor MP20 is turned off. As a result, the supply of the precharge voltage VPC1 to the node N10 is blocked off. On the other hand, the control signal SEQ_DC2 outputted from the level shifter LS1 is set to the high level, so that the generating operation of the reference power supply voltage VCI1 by the analog power supply circuit 13 and the voltage boosting operation of the voltage boosting circuit 14 are executed.

That is, in the present embodiment, the precharge circuit 17 supplies the precharge voltage VPC1 to the node N10 to boost the positive side gate power supply voltage VGH (precharge), like the first embodiment, while the control signal SEQ_ON is in the high level and the control signal VGIN1 is in the low levels. Also, in the second embodiment, the voltage VSPIN at the node N32 is almost equal to the analog power supply voltage VSP, which is fed back to the control signal SEQ_DC2 (the control of the generating operation of the reference power supply voltage VCI1 and the voltage boosting operation of the voltage boosting circuit 14). Therefore, comparing with the first embodiment, it is not necessary to output the control signal SEQ_DC2 as the control signals 120 and 123 from the control signal generating circuit 12 in the driver IC 1 of the second embodiment, and to output the control signal VGIN1 as the control signal 124 (reference to FIG. 6 and FIG. 11).

In the configuration mentioned above, it can be prevented that the reference power supply voltage VCI exceeds the positive side gate power supply voltage VGH at the time of the start-up of the driver IC 1, by controlling the timing of the supply start of the power supply voltage from the external power supply (not shown) and the control signal 124 appropriately.

(Timing of Supply Start of Power Supply Voltage and Voltage Boosting Operation of Positive Side Gate Power Supply Voltage VGH)

Hereinafter, referring to FIG. 8 and FIG. 9, the voltage boosting operation of the positive side gate power supply voltage VGH and the timing of the supply start of the power supply voltage in the second embodiment at the time of the start-up of the driver IC 1 will be described in detail.

Referring to FIG. 8, the logic power supply voltage VDDI and the analog power supply voltages VSP and VSN are supplied from the external power supply (not shown) at time t1. At this time, the negative side gate power supply voltage VGL drops down according to the dropping-down of the negative side analog power supply voltage VSN. Also, the logic power supply voltage VDD reaches a desired voltage in response to the supply of the logic power supply voltage VDDI, so that the control signal generating circuit 12 starts the operation.

The positive side gate power supply voltage VGH is precharged at time t2 after the logic power supply voltage VDD and the analog power supply voltages VSP and VSN reach the desired voltages and an enough time passes away. Referring to FIG. 9, at the time t2, the control signal SEQ_ON transits to the high level and the voltage VSPIN at the output node (node N32) of the CMOS circuit 71 rises based on the positive side analog power supply voltage VSP. At this time, because the control signal VGIN1 is fixed to the low level for a period for which the voltage VSPIN is lower than the analog power supply voltage VSP, the voltage (positive side gate power supply voltage VGH) at the positive side output node (node N10) of the voltage boosting circuit 14 is boosted based on the precharge voltage VPC1 according to the voltage VSPIN. Also, because the control signal SEQ_DC2 is fixed to the low level for a period of the above operation, the reference power supply voltage VCI1 is not supplied to the voltage boosting circuit 14 so that the voltage boosting circuit 14 does not carry out the voltage boosting operation (containing a negative voltage boosting operation), as shown in FIG. 8.

Next, when the positive side gate power supply voltage VGH is pulled up to a voltage almost equal to the positive side analog power supply voltage VSP at time t3, the control signal SEQ_DC2 transits to the high level. Thus, the reference power supply voltage VCI1 starts to be supplied to the voltage boosting circuit 14 so that the voltage boosting circuit 14 starts the voltage boosting operation. Also, when the positive side gate power supply voltage VGH is pulled up to the positive side analog power supply voltage VSP at the time t3, the control signal VGIN1 transits to the high level. Thus, the precharge control switch 72 (P-channel transistor MP20) is turned off to end the voltage boosting operation (precharging operation) to the positive side gate power supply voltage VGH by the precharging circuit 17.

Since the time t3, the positive side gate power supply voltage VGH is boosted to a predetermined voltage (e.g. 15 V) by the voltage boosting operation by the voltage boosting circuit 14. Also, referring to FIG. 8, like a general voltage boosting circuit, the negative side gate power supply voltage VGL is negatively boosted to a predetermined voltage (e.g. −15 V) at time t4 at which the positive side gate power supply voltage VGH becomes stable at the predetermined voltage.

In the present embodiment, although the supply of the reference power supply voltage VCI1 is not carried out during a period from the time t2 to the time t3, the positive side gate power supply voltage VGH is boosted to the predetermined voltage (in this case, the positive side analog power supply voltage VSP (for example, 6 V)). Therefore, even if the reference power supply voltage VCI1 with a short rising time starts to be supplied at the time t3, the reference power supply voltage VCI1 never exceeds the positive side gate power supply voltage VGH. As a result, there is no case that the parasitic transistors are turned on in the voltage boosting switches SW11 to SW14 of the voltage boosting circuit 14, thereby to restrain the generation of the latch up.

Also, the precharging circuit 17 of the present embodiment controls the start of generation of the reference power supply voltage VCI1 and the start of the voltage boosting operation of the voltage boosting circuit 14 according to the voltage level of the positive side gate power supply voltage VGH. Therefore, the control signals SEQ_DC2 and VGIN1 from the control signal generating circuit 12 are necessary in the first embodiment but are not necessary in the second embodiment.

Third Embodiment

A third embodiment is a modification example of the first embodiment, and controls the supply of the reference power supply voltage VCI2 to the voltage boosting circuit 14 and the precharging operation to the node N20 to which the negative side gate power supply voltage VGL is supplied, according to the control signal from the logic circuit (the control signal generating circuit 12). Hereinafter, referring to FIG. 5, FIG. 6, and FIG. 13 to FIG. 16, the display apparatus 100 according to the third embodiment of the present disclosure will be described.
(Configuration of Display Apparatus)

The third embodiment differs from the first embodiment in the point that the negative side gate power supply voltage VGL (to be referred to as output voltage) is precharged before the supply start of the reference power supply voltage VCI2. The configuration except for this different point is the same as that of the first embodiment. Below, the different point from the first embodiment will be described.

The voltage boosting circuit 14 outputs the positive side gate power supply voltage VGH generated by boosting the reference power supply voltage VCI1 and outputs the negative side gate power supply voltage VGL generated by negatively boosting the reference power supply voltage VCI2. In detail, referring to FIG. 6, the voltage decreasing operation (to be referred to as a negative voltage boosting operation) of the voltage boosting circuit 14 in the third embodiment is controlled according to the clock signals CLK and CLKB and the control signal 123 which contains the control signal SEQ_DC2.

Figure 13:
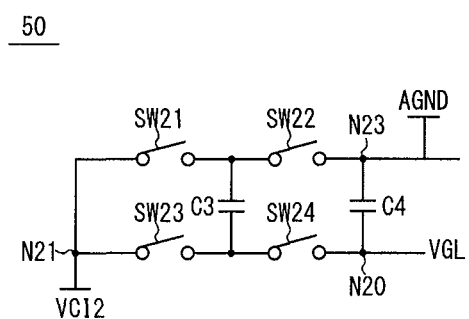
FIG. 13 is a diagram showing another example of the configuration of the charge pump circuit.

In more detail, the voltage boosting circuit 14 includes the charge pump circuit 50 which generates the negative side gate power supply voltage VGL by voltage-dropping the reference power supply voltage VCI2 (reference to FIG. 4 and FIG. 13). Referring to FIG. 13, the charge pump circuit 50 has voltage boosting switches SW21 to SW24, and capacitances C3 and C4. In detail, the voltage boosting switch SW21 and the voltage boosting switch SW22 are connected in series between a node N21 to which the reference power supply voltage VCI2 is supplied and a ground node N23, and the voltage boosting switch SW23 and the voltage boosting switch SW24 are connected in series between the node N21 and a node N20. The capacitance C3 is connected between one node to which the voltage boosting switch SW21 and the voltage boosting switch SW22 are connected and one node to which the voltage boosting switch SW23 and the voltage boosting switch SW24 are connected. Also, the capacitance C4 is connected between the node N20 and the ground node N23. The voltage boosting switches SW21 to SW24 are exemplified by transfer gates shown in FIG. 4, and the switching operation is controlled based on the clock signals CLK and CLKB which are supplied from the control signal generating circuit 12. Here, the clock signal CLKB (CLK) having the logical value opposite to the logic value of the clock signal CLK (CLKB) supplied to the P-channel transistors MP1 (N-channel transistor) of the voltage boosting switch SW21 and the voltage boosting switch SW24, is supplied to the P-channel transistors MP1 (N-channel transistor) of the voltage boosting switch SW22 and the voltage boosting switch SW23. Also, the operation start and operation end of the charge pump circuit 50 are controlled by the control signal SEQ_DC2 from the control signal generating circuit 12. For example, the charge pump circuit 50 does not operate when the control signal SEQ_DC2 is in the low level, and carries out the negative voltage boosting operation when the control signal SEQ_DC2 is in the high level.

The charge pump circuit 50 outputs a voltage of twice of the reference power supply voltage VCI2 which is supplied to the node N21, to the node N20 as the negative side gate power supply voltage VGL by charging and discharging the capacitances C3 and C4 through the switching operation of the voltage boosting switches SW21 to SW24. Note that FIG. 13 shows as an example, the charge pump circuit 50 which negatively boosts the voltage twice has been described, but the multiple of the negative voltage boosting operation can be optionally changed by changing the connection number of the voltage boosting switches and the capacitances.

Although the detailed description of the configuration is omitted, the voltage boosting circuit 14 has a general charge pump circuit which generates the positive side gate power supply voltage VGH, by boosting the reference power supply voltage VCI1. For example, the charge pump circuit which generates the positive side gate power supply voltage VGH has the same configuration as that of the charge pump circuit 40 shown in FIG. 3. However, although not shown in FIG. 3, the positive side analog power supply voltage VSP is supplied to the node N10 through a diode which is connected in a forward direction. Note that although FIG. 3 shows the charge pump circuit 40 which boosts to the voltage of twice of the analog power supply voltage VSP is exemplified, the multiple of the voltage boosting can be optionally changed by changing the connection number of the voltage boosting switches and the capacitances.

Referring to FIG. 5, in the precharging circuit 17 of the third embodiment, before the reference power supply voltage VCI2 is supplied to the voltage boosting circuit 14, the positive side gate power supply voltage VGH is boosted by using the precharge voltage VPC2 according to the negative side analog power supply voltage VSN (a dotted line of FIG. 5).

Referring to FIG. 6, in third embodiment, the supply operation of the precharge voltage VPC2 to the node N20 (the negative side gate power supply voltage VGL) is controlled according to the control signal 124 which contains the control signal SEQ_ON and the control signal VGIN2.

Figure 14:
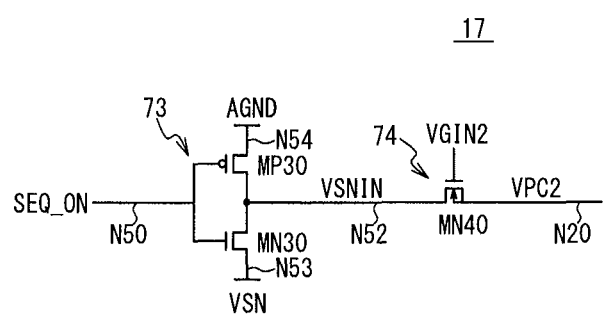
FIG. 14 is a diagram showing an example of the configuration of the precharging circuit in the third embodiment.

FIG. 14 is a diagram showing an example of the configuration of the precharging circuit 17 in the third embodiment. Referring to FIG. 14, the precharging circuit 17 of the third embodiment has a CMOS circuit 73 and a precharge control switch 74. The N-channel transistor MN40 which is exemplified by the N-channel MOS transistor is suitable for the precharge control switch 74 of the present embodiment. The N-channel transistor MN40 is connected between the node N52 as the output of CMOS circuit 73 and the node N20 to which the negative side gate power supply voltage VGL is supplied. The control signal VGIN2 is supplied to the gate of the N-channel transistor MN40. The CMOS circuit 73 includes an N-channel transistor MN30 having a source connected with a node N53 to which the negative side analog power supply voltage VSN is supplied, and a P-channel transistor MP30 having a source connected to a node N54 of the ground voltage. The gate of the P-channel transistor MP30 and the gate of the N-channel transistor MN30 are connected with a node N50 in common and each drain is connected with a node N52 in common.

The CMOS circuit 73 supplies the analog power supply voltage VSN to the node N52 when the control signal SEQ_ON transits to the high level. Thus, the voltage VSNIN of the node N52 drops to the analog power supply voltage VSN. For this time period, when the control signal VGIN2 in the high level is supplied, the N-channel transistor MN40 is turned on, and the voltage VSNIN of the node N52 is supplied to the node N20 as the precharge voltage VPC2. Thus, the voltage at the node N20 (the negative side gate power supply voltage VGL) drops to the analog power supply voltage VSN. That is, while the control signal SEQ_ON is in the high level and the control signal VGIN2 is in the high level, the precharging circuit 17 supplies the precharge voltage VPC2 to the node N20 and negatively boosts (precharges) the negative side gate power supply voltage VGL.

The precharge period to the node N20 (the negative side gate power supply voltage VGL) is controlled by the control signal VGIN2. In detail, when the control signal VGIN2 transits to the low level, the N-channel transistor MN40 is turned off, to block off the supply of the precharge voltage VPC2 to the node N20.

In this way, the precharging circuit 17 can drop down the voltage at the node N20 (precharge the node N20) (the negative side gate power supply voltage VGL) to a predetermined voltage (e.g. the analog power supply voltage VSN) for a period that is determined based on the control signal SEQ_ON and the control signal VGIN2. Note that the precharge period in the present embodiment is set by the control signal generating circuit 12.

In the above-mentioned configuration, it can be prevented that the reference power supply voltage VCI2 is set lower than the negative side gate power supply voltage VGL at the time of the start-up of the driver IC 1, by controlling the supply timing of the power supply voltages from the external power supply (not shown) and the control signals 120, 123, and 124 appropriately. Hereinafter, the supply timing of the power supply voltages and the voltage dropping operation of the negative side gate power supply voltage VGL at the time of the start-up of the driver IC 1 will be described in detail.

(Supply Timing of Power Supply Voltages and Voltage Dropping Operation of Negative Side Gate Power Supply Voltage VGL)

Figure 15:
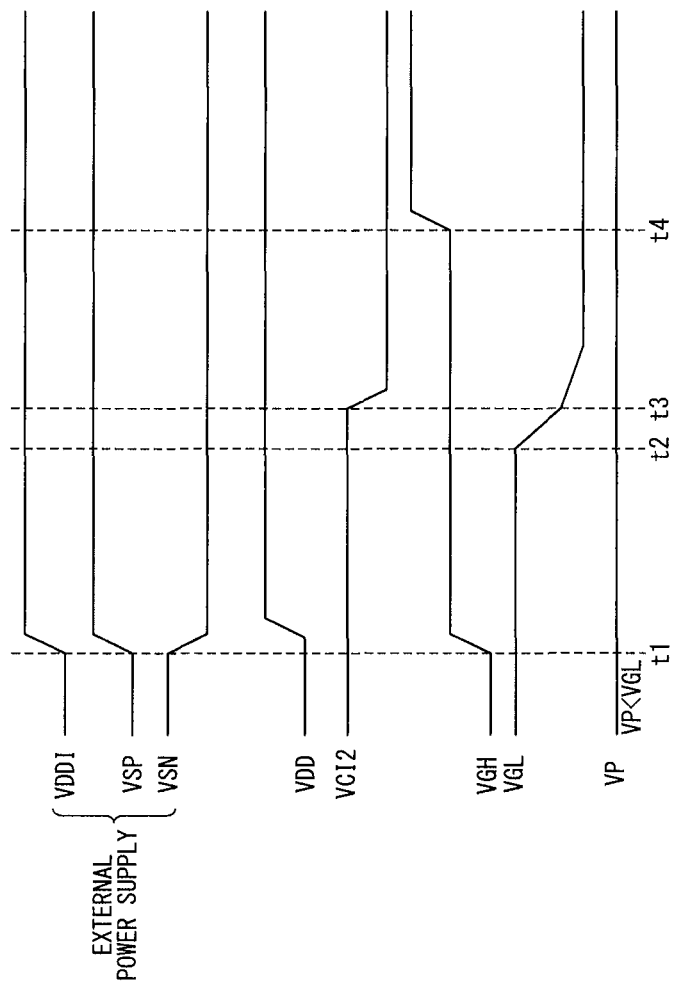
FIG. 15 is a timing chart showing an example of the supply timing of power supply voltages in the third and fourth embodiments.
Figure 16:
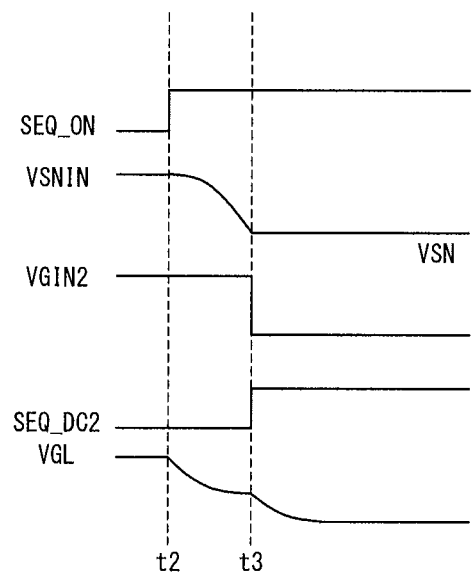
FIG. 16 is a timing chart showing an example of the start-up operation of the driver IC in the third and fourth embodiments.

FIG. 15 is a timing chart showing an example of the supply timing of the power supply voltages in the third embodiment. Also, FIG. 16 is a timing chart showing an example of the start-up operation of the driver IC in the third embodiment.

Referring to FIG. 15, the logic power supply voltage VDDI, and the analog power supply voltages VSP and VSN are supplied from the external power supply (not shown) at time t1. At this time, the positive side gate power supply voltage VGH rises up according to the rising of the positive side analog power supply voltage VSP. Although the detailed description is omitted here, the positive side charge pump circuit in the third embodiment has the same configuration as the charge pump circuit 40 shown in FIG. 3, and the positive side analog power supply voltage VSP is supplied to the node N10 through the diode (not shown). Therefore, at the time t1, the positive side gate power supply voltage VGH rises up. Also, the logic power supply voltage VDD reaches a desired voltage with the supply of the logic power supply voltage VDDI, to start the operation of the control signal generating circuit 12.

The negative side gate power supply voltage VGL is precharged with the negative voltage at time t2 after logic power supply voltage VDD, and the analog power supply voltages VSP and VSN reach desired voltages and then an enough time passed away. Referring to FIG. 16, at the time t2, the control signal SEQ_ON transits to the high level, and the voltage VSNIN at the output node (node N52) of the CMOS circuit 73 drops down based on the negative side analog power supply voltage VSN. At this time, because the control signal VGIN2 is fixed to the high level, the voltage at the negative side output node (node N20) (the negative side gate power supply voltage VGL) of the voltage boosting circuit 14 is dropped down in voltage due to the precharge voltage VPC2 according to the voltage VSNIN. Also, at the time t2, because the control signal SEQ_DC2 is fixed to the low level, the reference power supply voltage VCI2 is not supplied to the voltage boosting circuit 14 and the voltage boosting circuit 14 does not carry out the voltage boosting operation (containing a negative voltage boosting operation), as shown in FIG. 8.

Next, the control signal SEQ_DC2 transits to the high level at time t3 when the negative side gate power supply voltage VGL is raised to a voltage almost equal to the negative side analog power supply voltage VSN. Thus, the reference power supply voltage VCI2 starts to be supplied to the voltage boosting circuit 14 to start the voltage boosting operation by the voltage boosting circuit 14. On the other hand, the control signal VGIN2 transits to the low level at substantially the same time as the transition of the control signal SEQ_DC2 to the high level or after the transition of the control signal SEQ_DC2 to the high level. In this way, the precharge control switch 74 (N-channel transistor MN40) is turned off so that the negative voltage boosting operation (precharging operation) of the negative side gate power supply voltage VGL by the precharging circuit 17 is ended.

Since the time t3, the negative side gate power supply voltage VGL is negatively boosted to a predetermined voltage (e.g. −15 V) through the negative voltage boosting operation by the voltage boosting circuit 14. Also, referring to FIG. 15, at time t4 when the negative side gate power supply voltage VGL is stabled at the predetermined voltage, the positive side gate power supply voltage VGH is boosted to a predetermined voltage (e.g. 15 V), like the usual voltage boosting circuit.

Here, when a substrate voltage VP (back gate voltage of N-channel transistor MN1) of the voltage boosting switches SW21 to SW24 of the charge pump circuit 50 is lower than the negative side gate power supply voltage VGL, a parasitic transistor operates to cause a latch-up when the reference power supply voltage VCI2 drops below the negative side gate power supply voltage VGL. However, in the present embodiment, the supply of the reference power supply voltage VCI2 is not carried out from a period from the time t2 to the time t3, so that the negative side gate power supply voltage VGL is dropped to the predetermined voltage (in this case, the negative side analog power supply voltage VSN (for example, −6 V)). Therefore, even if the reference power supply voltage VCI2 with a short falling time starts to be supplied at the time t3, the reference power supply voltage VCI2 never drops below the negative side gate power supply voltage VGL. As a result, the parasitic transistors are never turned on in the voltage boosting switches SW21 to SW24 of the voltage boosting circuit 14, which restrains the occurrence of the latch up.

Fourth Embodiment

A fourth embodiment is a modification example of the second embodiment, and the supply of the reference power supply voltage VCI2 to the voltage boosting circuit 14 and the precharging operation to the node N20 to which the negative side gate power supply voltage VGL (to be also referred to as an output voltage) is supplied, are controlled according to the control signal generated by the precharging circuit 17. Hereinafter, referring to FIG. 10, FIG. 11, FIG. 13, and FIG. 15 to FIG. 17, the display apparatus 100 according to the fourth embodiment of the present disclosure will be described.

(Configuration of Display Apparatus)

FIG. 10 is a diagram showing an example of the configuration of the display apparatus 100 in the fourth embodiment. Referring to FIG. 14, the display apparatus 100 has the driver IC 1 and the display panel 2. The fourth embodiment differs from the third embodiment in the point that the generation of the reference power supply voltage VCI2 and the negative voltage boosting operation by the voltage boosting circuit 14 are controlled by the precharging circuit 17. The configuration except for this difference point is the same as the configuration of the third embodiment. Below, the difference point from the third embodiment will be described.

Referring to FIG. 11, the voltage boosting operation of the voltage boosting circuit 14 of the fourth embodiment is controlled according to the control signal 123 which contains the clock signals CLK and CLKB and the control signal SEQ_DC2 outputted from the precharging circuit 17.

The precharging circuit 17 of the fourth embodiment boosts the voltage at the node N20 to which the negative side gate power supply voltage VGL is to be supplied, based on the precharge voltage VPC2, before the reference power supply voltage VCI2 is supplied to the voltage boosting circuit 14. In detail, referring to FIG. 11, in the fourth embodiment, the supply operation of precharge voltage VPC2 to the node N20 is controlled according to the control signal 124 which contains the control signal SEQ_ON.

Figure 17:
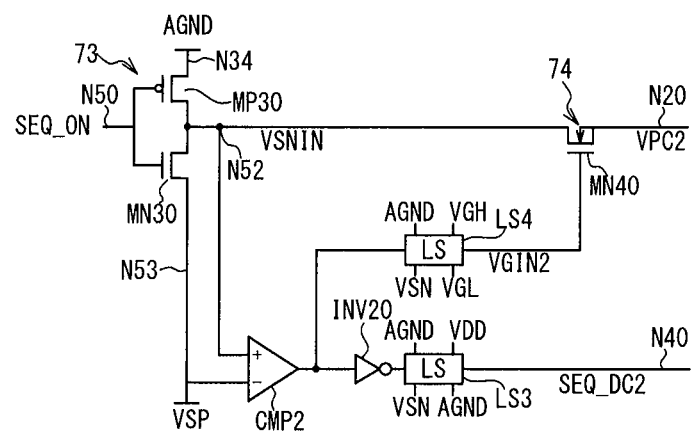
FIG. 17 is a diagram showing an example of the configuration of the precharging circuit in the fourth embodiment.

FIG. 17 is a diagram showing an example of the configuration of the precharging circuit 17 according to the fourth embodiment. Referring to FIG. 17, the precharging circuit 17 of the fourth embodiment has the CMOS circuit 73, the precharge control switch 74, a comparator CMP2, an inverter INV20 and level shifters LS3 and LS4. The N-channel transistor MN40 which is exemplified by the N-channel MOS transistor is suitable for the precharge control switch 74 of the present embodiment. The N-channel transistor MN40 is connected between the node N52 as the output of the CMOS circuit 73 and the node N20 to which the negative side gate power supply voltage VGL is supplied. The control signal VGIN2 is supplied to the gate of the N-channel transistor MN40. The CMOS circuit 73 includes the N-channel transistor MN30 having a source connected with the node N53 to which the negative side analog power supply voltage VSN is supplied, and the P-channel transistor MP30 having a source connected to the node N54 of the ground voltage. The gate of the P-channel transistor MP30 and the gate of the N-channel transistor MN30 are connected with the node N50 in common and each drain is connected with the node N52 in common. The inverter INV20 is connected between the output terminal of the comparator CMP2 and the input terminal of the level shifter LS3, to invert the output of the comparator CMP2 to output to the level shifter LS3.

The node N52 (the output of the CMOS circuit 73) is connected with the non-inversion input terminal of the comparator CMP2 and is connected with the node N20 through the precharge control switch 74 (N-channel transistor MN40). The node N53 is connected with the inversion input terminal of the comparator CMP2. The output terminal of the comparator CMP2 is connected with the input terminal of the level shifter LS4 and is connected with the input terminal of the level shifter LS3 through the inverter INV20. The output terminal of the level shifter LS3 is connected with the analog power supply circuit 13 and the voltage boosting circuit 14 through the node N40 (reference to FIG. 11 and FIG. 17). The output terminal of the level shifter LS4 is connected with the control node (in this case, the gate of the N-channel transistor MN40) of the precharge control switch 74.

The comparator CMP2 outputs to the level shifters LS3 and LS4, a signal of a logical level according to the comparison result of the analog power supply voltage VSN supplied to the node N53 and the voltage VSNIN at the node N52. The level shifter LS2 shifts the output signal level of the comparator CMP2 from the analog power supply voltage level (VSN) to the logic power supply voltage level (VDD) and outputs it as the control signal SEQ_DC2. The level shifter LS4 shifts the output signal level of the comparator CMP2 from the analog power supply voltage level (VSN) to the gate power supply voltage level (VGH-VGL) and outputs it as the control signal VGIN2.

The CMOS circuit 73 supplies the analog power supply voltage VSN to the node N52 when the control signal SEQ_ON transits to the high level. Thus, the voltage VSNIN at the node N52 drops to the analog power supply voltage VSN. When the voltage VSNIN is greater than the negative side analog power supply voltage VSN, the comparator CMP2 outputs a signal of the high level. Specifically, when the voltage VSNIN is greater than a value obtained by subtracting an offset voltage from the negative side analog power supply voltage VSN (e.g. VSN—100 mV), the comparator CMP2 outputs a signal of the high level. At this time, the control signal VGIN2 outputted from the level shifter LS2 is set to the high level to turn on the N-channel transistor MN40. As a result, the voltage VSNIN at the node N52 is supplied to the node N20 as the precharge voltage VPC2, and the voltage at the node N20 (the negative side gate power supply voltage VGL) drops to the analog power supply voltage VSN. On the other hand, the control signal SEQ_DC2 outputted from the level shifter LS3 is set to the low level to stop the generating operation of the reference power supply voltage VCI1 by the analog power supply circuit 13 and the voltage boosting operation by the voltage boosting circuit 14 (or, inhibit to start the operations).

When the voltage VSNIN becomes smaller than the negative side analog power supply voltage VSN, the comparator CMP2 outputs a signal of the low level. Specifically, when the voltage VSNIN is smaller than a value obtained by subtracting an offset voltage from the negative side analog power supply voltage VSN (e.g. VSN—100 mV), the comparator CMP2 outputs a signal of the low level. At this time, the control signal VGIN2 outputted from the level shifter LS4 is set to the low level, to turn off the N-channel transistor MN40. As a result, the supply of the precharge voltage VPC2 to the node N20 is blocked off. On the other hand, the control signal SEQ_DC2 outputted from the level shifter LS3 is set to the high level, so that the generating operation of the reference power supply voltage VCI1 by the analog power supply circuit 13 and the voltage boosting operation by the voltage boosting circuit 14 are executed.

That is, in this embodiment, too, the precharging circuit 17 supplies the precharge voltage VPC2 to the node N20 and drops down (precharge) the negative side gate power supply voltage VGL, for a period for which the control signal SEQ_ON is in the high level and the control signal VGIN2 is in the high level, like the third embodiment. Also, in the fourth embodiment, it is detected that the voltage VSNIN at the node N52 becomes substantially equal to the analog power supply voltage VSN, and this is fed back to the control signal SEQ_DC2 (the control of the generating operation of the reference power supply voltage VCI2 and the voltage dropping operation by the voltage boosting circuit 14). Therefore, comparing with the third embodiment, in the driver IC 1 of the fourth embodiment, it is not necessary to output the control signal SEQ_DC2 as the control signals 120 and 123 and to output the control signal VGIN1 as the control signal 124 from the control signal generating circuit 12 (reference to FIG. 6 and FIG. 11).

In the above-mentioned configuration, it can be prevented that the reference power supply voltage VCI2 exceeds the negative side gate power supply voltage VGL at the time of the start-up of the driver IC 1, by controlling a supply timing of the power supply voltages from the external power supply (not shown) and the control signal 124 appropriately.

(Supply Timing of Power Supply Voltages and Voltage Boosting Operation of Positive Side Gate Power Supply Voltage VGH)

Hereinafter, referring to FIG. 15 and FIG. 16, the supply timing of the power supply voltage and the voltage boosting operation of the negative side gate power supply voltage VGL at the time of the start-up of the driver IC 1 in the fourth embodiment will be described in detail.

Referring to FIG. 15, the logic power supply voltage VDDI, and the analog power supply voltages VSP and VSN are supplied from the external power supply (not shown) at time t1. At this time, the positive side gate power supply voltage VGH rises up according to the dropping-down of the positive side analog power supply voltage VSP. Also, the logic power supply voltage VDD reaches a desired voltage with the supply of the logic power supply voltage VDDI, to start the control signal generating circuit 12.

The negative side gate power supply voltage VGL is precharged at time t2 that the logic power supply voltage VDD and the analog power supply voltages VSP and VSN reach desired voltages and then an enough time passed away. Referring to FIG. 16, at the time t2, the control signal SEQ_ON transits to the high level and the voltage VSNIN at the output node (node N52) of the CMOS circuit 73 is dropped down based on the negative side analog power supply voltage VSN. At this time, because the control signal VGIN2 is fixed to the high level while the voltage VSNIN exceeds the analog power supply voltage VSN, the voltage (negative side gate power supply voltage VGL) at the negative side output node (node N20) of the voltage boosting circuit 14 is dropped down based on the precharge voltage VPC2 according to the voltage VSNIN. Also, for a period of this operation, because the control signal SEQ_DC2 is fixed to the low level, the reference power supply voltage VCI2 is not supplied to the voltage boosting circuit 14 and the voltage boosting circuit 14 does not carry out the voltage boosting operation (containing the negative voltage boosting operation), as shown in FIG. 15.

Next, at time t3, when the negative side gate power supply voltage VGL is dropped down to a voltage substantially equal to the negative side analog power supply voltage VSN, the control signal SEQ_DC2 transits to the high level. Thus, the reference power supply voltage VCI2 starts to be supplied to the voltage boosting circuit 14 so that the voltage boosting circuit 14 starts the voltage boosting operation. Also, at the time t3, when the negative side gate power supply voltage VGL is dropped down to the voltage substantially equal to the negative side analog power supply voltage VSN, the control signal VGIN2 transits to the low level. Thus, the precharge control switch 74 (N-channel transistor MN40) is turned off and the negative voltage boosting operation (precharge) of the negative side gate power supply voltage VGL by the precharging circuit 17 is ended.

Since the time t3, the negative side gate power supply voltage VGL is boosted to a predetermined voltage (e.g. −15 V) through the voltage boosting operation by the voltage boosting circuit 14. Also, referring to FIG. 15, at time t4 that the negative side gate power supply voltage VGL is stabilized at the predetermined voltage like the usual voltage boosting circuit, the positive side gate power supply voltage VGH is negatively boosted to a predetermined voltage (e.g. 15 V).

In the present embodiment, although the supply of the reference power supply voltage VCI2 is not carried out for a period from the time t2 to the time t3, the negative side gate power supply voltage VGL is dropped down to a predetermined voltage (in this case, the negative side analog power supply voltage VSN (e.g. −6 V)). Therefore, even if the reference power supply voltage VCI2 with a short falling time starts to be supplied at the time t3, the reference power supply voltage VCI2 never drops below the negative side gate power supply voltage VGL. As a result, when the substrate voltage VP of the voltage boosting switches SW21 to SW24 in the voltage boosting circuit 14 is lower than the negative side gate power supply voltage VGL, there is no case that parasitic transistors of the voltage boosting switches SW21 to SW24 turn on, so that the occurrence of the latch-up is restrained.

Also, the precharging circuit 17 in the present embodiment controls the generation start of the reference power supply voltage VCI2 and the start of the voltage boosting operation of the voltage boosting circuit 14 according to the voltage level of the negative side gate power supply voltage VGL. Therefore, the control signals SEQ_DC2 and VGIN2 from the control signal generating circuit 12 which are necessary in the third embodiment become unnecessary.

As mentioned above, an external element like a schottky barrier diode is not needed, because the latch up of the voltage boosting circuit can be prevented at the time of start-up by an internal circuit loaded in the driver IC 1. Therefore, it is possible to prevent the occurrence of the latch-up at the time of the start-up of the driver IC while restraining the increase of the mount area and cost.

Also, because the voltage boosting operation of the positive side gate power supply voltage VGH or the negative voltage boosting operation of the negative side gate power supply voltage VGL is carried out by using the analog power supply voltage VSP or the analog power supply voltage VSN which is supplied from the external power supply before supply of the reference power supply voltages VCI1 and VCI2, a time required until the gate power supply voltages VGH and VGL become stable at desired values can be reduced to be shorter than a conventional technique.

Moreover, in the present disclosure, when the latch-up is prevented at the time of start of the voltage boosting operation of one of the gate power supply voltages VGH and VGL (e.g. the positive side gate power supply voltage VGH), the other (e.g. the negative side gate power supply voltage VGL) can be boosted as in the conventional operation. That is, according to the present disclosure, it is enough to incorporate the above-mentioned configuration for preventing the latch-up into one of the gate power supply voltages VGH and VGL and it is not necessary to change the configuration for controlling the other.

In the above, the embodiments of the present disclosure have been described in detail. However, the present disclosure is not limited to the specific configurations of the above-mentioned embodiments and a modification in the range which does not deviate from the gist of the present invention is contained in the present disclosure. For example, in the above-mentioned embodiments, the reference power supply voltages VCI1 and VCI2 are generated by the analog power supply circuit 13 as an internal circuit. However, they may be supplied from the external power supply. In this case, the supply timing of the reference power supply voltages VCI1 and VCI2 must be at the above-mentioned timing.

Also, in the above-mentioned embodiment, the integrated circuit device which is used for the driver IC for driving the display panel 2 is exemplified but the present invention is not limited to this. If the voltage boosting operation (containing negative voltage boosting operation) is carried out before the supply of the reference power supply voltage and the latch-up can be prevented at the time of start of the voltage boosting operation, the present technology can be applied to another apparatus (for example, a driver IC which drives memory cells).

What is claimed is:

1. An integrated circuit device comprising:
   a voltage boosting circuit configured to operate on a first power supply voltage and boost an output voltage generated on a first node to a first voltage level;
   a precharging circuit configured to supply a second power supply voltage to the first node, the second power supply voltage having a second voltage level lower than the first voltage level; and
   a control signal generating circuit configured to generate a plurality of control signals, wherein the precharging circuit supplies the second power supply voltage to the first node before the first power supply voltage starts to be supplied to the voltage boosting circuit based on a first control signal of the plurality of control signals, and
   wherein the voltage boosting circuit is operational to boost the output voltage, by a switching operation of transistors, to back gates of which the output voltage is supplied.

2. The integrated circuit device according to claim 1, wherein the precharging circuit comprises a precharge control switch configured to control a connection of the first node and a second node to which the second power supply voltage is supplied, based on the first control signal, and wherein the precharge control switch connects the first node and the second node before the first power supply voltage is supplied to the voltage boosting circuit.

3. The integrated circuit device according to claim 2, wherein the voltage boosting operation of the output voltage by the voltage boosting circuit is controlled based on a second control signal of the plurality of control signals.

4. The integrated circuit device according to claim 2, wherein the precharging circuit outputs the first control signal and a second control signal of the plurality of control signals based on a comparison of the output voltage and a voltage supplied to the second node, and
   wherein the voltage boosting operation of the output voltage by the voltage boosting circuit is controlled based on the second control signal.

5. The integrated circuit device according to claim 3, further comprising:
   a power supply circuit configured to generate the first power supply voltage to output to the voltage boosting circuit,
   wherein a generating operation of the first power supply voltage by the power supply circuit is controlled based on the second control signal.

6. The integrated circuit device according to claim 4, further comprising:
   a power supply circuit configured to generate the first power supply voltage to output to the voltage boosting circuit,
   wherein a generating operation of the first power supply voltage by the power supply circuit is controlled based on the second control signal.

7. The integrated circuit device according to claim 2, wherein the precharging circuit further comprises a CMOS circuit configured to control the supply of the second power supply voltage to the second node.

8. A display panel driver comprising:
   an integrated circuit device; and
   a gate driving circuit configured to generate a gate line drive signal based on an output voltage, to drive gate lines of a display panel,
   wherein the integrated circuit device comprises:
   a voltage boosting circuit configured to operate on a first power supply voltage and boost the output voltage generated on a first node to a first voltage level;
   a precharging circuit configured to supply a second power supply voltage to the first node, the second power supply voltage having a second voltage level lower than the first voltage level; and
   a control signal generating circuit configured to generate a plurality of control signals, wherein the precharging circuit supplies the second power supply voltage to the first node before the first power supply voltage starts to be supplied to the voltage boosting circuit based on a first control signal of the plurality of control signals, and
   wherein the voltage boosting circuit is operational to boost the output voltage, by a switching operation of transistors, to back gates of which the output voltage is supplied.

9. The display panel driver according to claim 8, wherein the precharging circuit comprises:
   a precharge control switch configured to control a connection of the first node and a second node to which the second power supply voltage is supplied, based on the first control signal, and wherein the precharge control switch connects the first node and the second node before the first power supply voltage is supplied to the voltage boosting circuit.

10. The display panel driver according to claim 9, wherein the voltage boosting operation of the output voltage by the voltage boosting circuit is controlled based on a second control signal of the plurality of control signals.

11. The display panel driver according to claim 9, wherein the precharging circuit outputs the first control signal and a second control signal of the plurality of control signals based on a comparison of the output voltage and a voltage supplied to the second node, and
wherein the voltage boosting operation of the output voltage by the voltage boosting circuit is controlled based on the second control signal.

12. The display panel driver according to claim 10, further comprising:
a power supply circuit configured to generate the first power supply voltage to output to the voltage boosting circuit,
wherein a generating operation of the first power supply voltage by the power supply circuit is controlled based on the second control signal.

13. The display panel driver according to claim 11, further comprising:
a power supply circuit configured to generate the first power supply voltage to output to the voltage boosting circuit,
wherein a generating operation of the first power supply voltage by the power supply circuit is controlled based on the second control signal.

14. The display panel driver according to claim 9, wherein the precharging circuit further comprises:
a CMOS circuit configured to control the supply of the second power supply voltage to the second node.

15. A display apparatus comprising:
a display panel driver; and
a display panel having gate lines driven by a gate line drive signal,
wherein the display panel driver comprises:
an integrated circuit device; and
a gate driving circuit configured to generate the gate line drive signal based on an output voltage, to drive the gate lines of the display panel,
wherein the integrated circuit device comprises:
a voltage boosting circuit configured to operate on a first power supply voltage and boost the output voltage generated on a first node to a first voltage level and a precharging circuit configured to supply a second power supply voltage to the first node, the second power supply voltage having a second voltage level lower than the first voltage level; and
a control signal generating circuit configured to generate a plurality of control signals, wherein the precharging circuit supplies the second power supply voltage to the first node before the first power supply voltage starts to be supplied to the voltage boosting circuit based on a first control signal of the plurality of control signals, and
wherein the voltage boosting circuit is operational to boost the output voltage, by a switching operation of transistors, to back gates of which the output voltage is supplied.

16. A voltage boosting method comprising:
generating a plurality of control signals;
supplying a second power supply voltage to a first node before a first power supply voltage starts to be supplied to a voltage boosting circuit based on first control signal of the plurality of control signals; and
boosting an output voltage generated on the first node to a first voltage level by the voltage boosting circuit operating on the first power supply voltage, the first voltage level being higher than a second voltage level of the second power supply voltage,
wherein the voltage boosting circuit is operational to boost the output voltage, by a switching operation of transistors, to back gates of which the output voltage is supplied.

17. The voltage boosting method according to claim 16, further comprising:
controlling a start or end of the voltage boosting operation of the output voltage based on the supplied second power supply voltage, based on a comparison result of the output voltage and the supplied second power supply voltage.

18. The voltage boosting method according to claim 16, further comprising:
controlling a start or end of the voltage boosting operation of the output voltage based on the first power supply voltage, based on a comparison result of the output voltage and the supplied second power supply voltage.

19. The voltage boosting method according to claim 16, further comprising:
controlling a supply start of the first power supply voltage to the voltage boosting circuit, based on a comparison result of the output voltage and the supplied second power supply voltage.

* * * * *